(12) United States Patent  
Chern

(10) Patent No.: US 7,528,752 B1  
(45) Date of Patent: May 5, 2009

(54) OFFSET COMPENSATION SCHEME USING A DAC

(75) Inventor: Jenn-Gang Chern, Redwood City, CA (US)

(73) Assignee: Link_A_Media Devices Corporation, Santa Clara, CA (US)

( * ) Notice: Subject to any disclaimer, the term of this patent is extended or adjusted under 35 U.S.C. 154(b) by 0 days.

(21) Appl. No.: 11/787,141

(22) Filed: Apr. 13, 2007

(51) Int. Cl.
*H03M 1/06* (2006.01)

(52) U.S. Cl. .................... 341/118; 341/144

(58) Field of Classification Search .......... 341/118–155
See application file for complete search history.

(56) References Cited

U.S. PATENT DOCUMENTS

| | | | |
|---|---|---|---|
| 5,861,829 A | 1/1999 | Sutardja | |
| 6,191,715 B1 * | 2/2001 | Fowers | 341/120 |
| 6,556,154 B1 * | 4/2003 | Gorecki et al. | 341/118 |
| 6,822,600 B1 * | 11/2004 | Taft et al. | 341/155 |
| 7,250,880 B2 * | 7/2007 | Hurrell et al. | 341/111 |
| 7,319,419 B1 * | 1/2008 | Lash et al. | 341/118 |

\* cited by examiner

*Primary Examiner*—Lam T Mai
(74) *Attorney, Agent, or Firm*—Van Pelt, Yi & James LLP

(57) ABSTRACT

An offset compensation scheme using a digital-to-analog converter (DAC) is disclosed. In some embodiments, a DAC is coupled to a circuit having an undesired current or voltage offset and is configured to at least in part compensate for the undesired current or voltage offset. For example, in some embodiments, the DAC injects current or voltage into the circuit that shifts a current or voltage of the circuit by an amount equal or similar in magnitude but opposite in polarity to a shift in the current or voltage of the circuit caused by the undesired current or voltage offset.

25 Claims, 5 Drawing Sheets

US 7,528,752 B1

OFFSET COMPENSATION SCHEME USING A DAC

BACKGROUND OF THE INVENTION

Offset voltages may be introduced into a circuit as a result of component variations arising from non-ideal manufacturing processes. Such offset voltages may affect normal circuit operation. Thus, there is a need to cancel or compensate for offset voltages.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

An offset compensation scheme using a digital-to-analog converter (DAC) is disclosed. In some embodiments, a DAC is coupled to a circuit having an undesired current or voltage offset and is configured to at least in part compensate for the undesired current or voltage offset. For example, in some embodiments, the DAC injects current or voltage into the circuit that shifts a current or voltage of the circuit by an amount equal or similar in magnitude but opposite in polarity to a shift in the current or voltage of the circuit caused by the undesired current or voltage offset.

Figure 1:
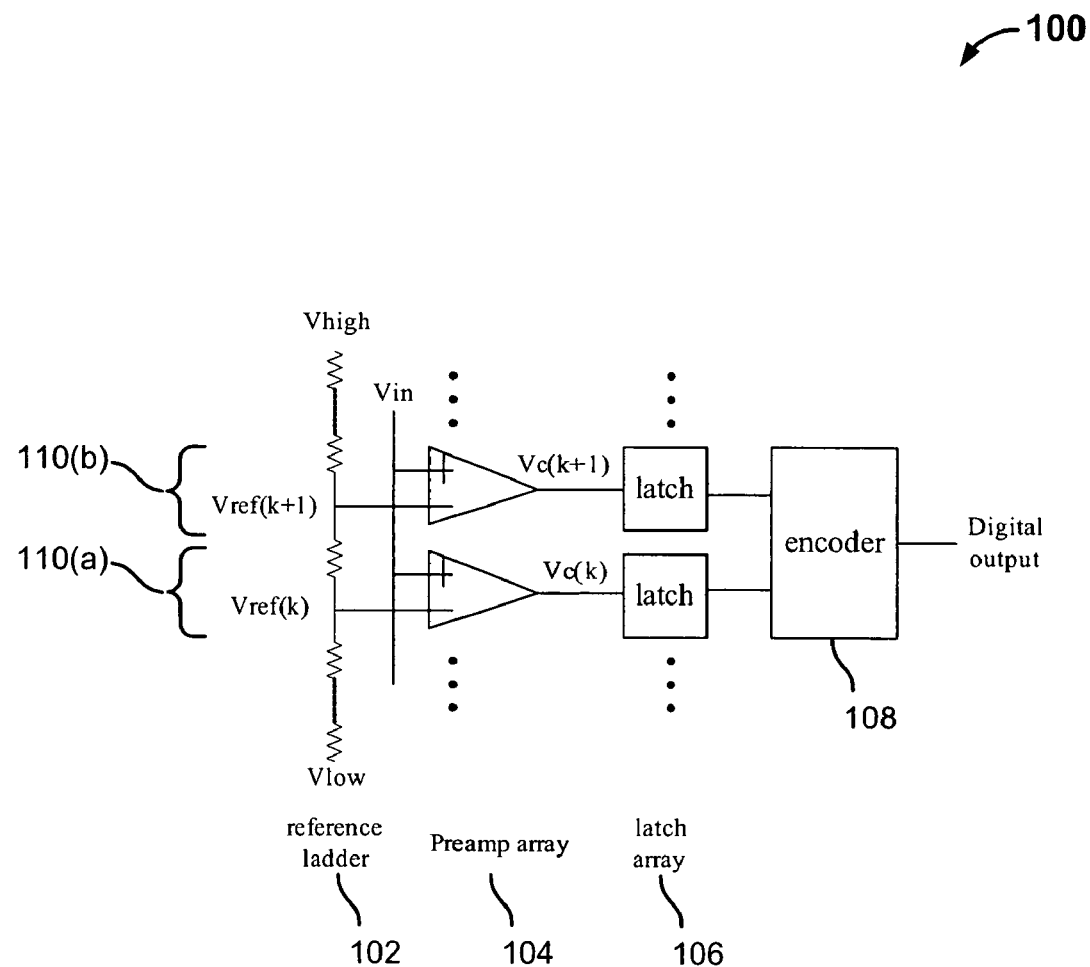
FIG. 1 illustrates a block diagram of an embodiment of an analog-to-digital converter.

FIG. 1 illustrates a block diagram of an embodiment of an analog-to-digital converter (ADC). ADC 100 in the given example comprises a flash ADC. As depicted, ADC 100 includes a reference ladder 102 that generates a series of reference voltages that define the thresholds of the ADC 100; a preamplifier array 104 that amplifies the difference between $V_{in}$ and $V_{ref}$; a latch array 106 that converts analog voltages to digital voltages, e.g., on clock edges; and encoder logic 108 that compresses the latch outputs to a compact digital format. ADC 100 is comprised of a plurality of slices. The number of slices included in an ADC depends on the resolution of the ADC. For example, an ADC with a resolution of six bits includes sixty-four slices (since $2^6=64$). Two slices 110(a) and 110(b) of ADC 100 are depicted in FIG. 1. A different threshold or reference voltage from reference ladder 102 is associated with each slice. The least significant bit (LSB) of an ADC is the minimum increment of voltage (i.e. the step size between the reference voltages of the reference ladder 102) that the ADC can convert and depends on the operating input voltage range of the ADC. The operation of ADC 100 includes comparing an analog input voltage ($V_{in}$) with the reference voltage ($V_{ref}$) of each slice and generating a digital output for each slice. For example, if $V_{in}$ is greater than the $V_{ref}$ of a slice, the digital output of that slice may be a one; and if $V_{in}$ is less than the $V_{ref}$ of a slice, the output of that slice may be a zero. The digital outputs of all the slices are compressed into a more compact code by encoder 108. For example, the sixty-four digital outputs of sixty-four slices can be compressed into a six bit code.

Accuracy of the effective reference voltages is needed in order for an ADC to behave linearly. However, the accuracy of reference voltages may be compromised due to offset voltages arising from component variations, such as MOSFET threshold and/or mobility mismatches, random variations of resistors and/or capacitors, etc., that result from non-ideal manufacturing processes. Such a problem is especially pronounced when an ADC is realized in CMOS processes since in such cases the resulting net offset voltages tend to be relatively large compared to the LSB size of the ADC due to the use of relatively small transistors to achieve high speeds. Shifts in reference voltages from their ideal values may result from offset voltages contributed by any component and/or stage of an ADC. In some cases, offset voltages primarily occur in the preamplifier and/or latch. Because the reference ladder can be realized using relatively well matched components, e.g., using resistors and/or capacitors, in some cases, the reference ladder contributes relatively small amounts of offset voltages. The latches, on the other hand, could contribute significantly to the overall offset voltages due to, for example, their small sizes (for high speed and low power) and relatively low gain in the preamplifier array which may not provide enough offset attenuation.

For each slice, the various built-in offset voltages that arise throughout the slice can be referred back to the input stage and be represented by a single cumulative input offset voltage ($V_{os}$). This offset voltage ($V_{os}$) appears to be effectively added to the ideal reference voltage ($V_{ref}$) associated with the slice. For example, instead of $V_{ref}$, $V_{ref}$-$V_{os}$ effectively appears at the preamplifier input of the slice. This shift in $V_{ref}$ from its ideal value due to $V_{os}$ may cause a corresponding shift in an associated decision (transition) boundary and may cause the transfer code associated with the slice to shift from an ideal value. Thus, in order for an ADC to properly operate, the offset voltage $V_{os}$ may need to at least in part be compensated for. An offset cancellation scheme may be employed to compensate for or at least mitigate the offset voltage $V_{os}$. For example, the effect of $V_{os}$ can be (mostly) cancelled if another offset voltage of the same or nearly the same magnitude but opposite polarity is cascaded with $V_{os}$.

Figure 2:
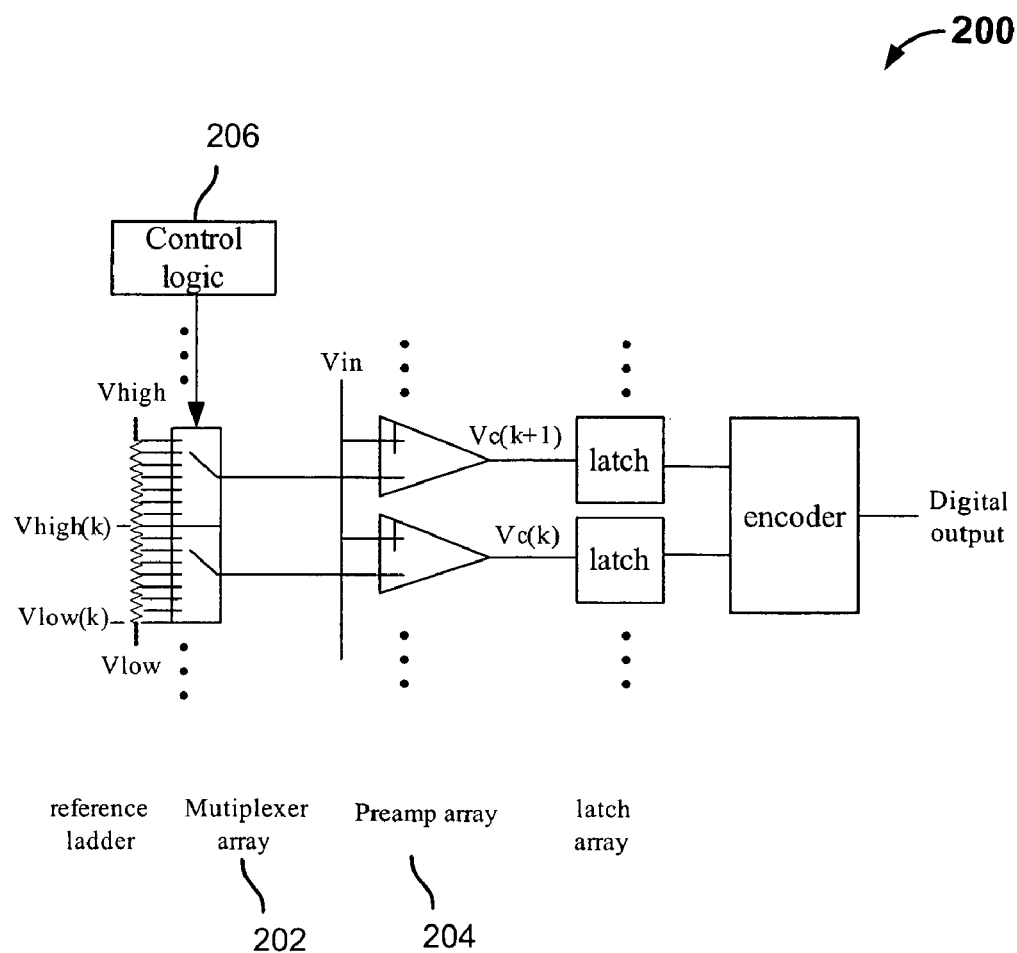
FIG. 2 illustrates a block diagram of an ADC that employs an offset compensation scheme.

In one technique for offset compensation, the reference voltage associated with a slice is selectable from a range of values. FIG. 2 illustrates a block diagram of an ADC that employs such an offset compensation scheme. ADC 200 is similar to ADC 100 of FIG. 1 with the exception that ADC 200 includes a multiplexer array 202 for selecting the reference voltages of the slices. In ADC 100 of FIG. 1, fixed reference voltages are implied. That is, the reference resistor chain of reference ladder 102 is tapped at fixed intervals corresponding to the LSB of ADC 100 to obtain the reference voltages of the slices. Instead of such fixed reference voltages, in ADC 200 of FIG. 2, multiple reference voltages are multiplexed into the preamplifier array 204. For each slice, the reference voltage from the set of available reference voltages that best cancels out the built-in offset voltage ($V_{os}$) of the slice is selected as the reference voltage. For example, if the built-in offset voltage $V_{os}$ of a slice is positive, a lower reference voltage $V_{ref}$ can be selected for the slice to compensate for the positive built-in offset voltage $V_{os}$. Similarly, if the built-in offset voltage $V_{os}$ of a slice is negative, a higher reference voltage $V_{ref}$ can be selected for the slice to compensate for the negative built-in offset voltage $V_{os}$. The most suitable reference voltage to cancel or compensate for the built-in offset voltage of a slice is selected from the set of available reference voltages so that an ideal or near ideal reference voltage effectively appears at the preamplifier input of the slice. Any appropriate technique can be employed to select or calibrate the reference voltages of the slices. For example, to calibrate a slice, the ideal reference voltage desired for the slice can be applied to the input voltage ($V_{in}$) line, and the reference voltage can be swept from its local high value to its local low value to determine the transition point at which the output switches from zero to one. The reference voltage of the slice can be calibrated to either of the reference voltages that result in the zero or one of the transition boundary.

In the offset compensation scheme depicted in FIG. 2, the reference voltage range and resolution are predetermined. As depicted, the reference voltage range of slice(k) is delimited by $V_{high}(k)$ and $V_{low}(k)$, and the resolution is determined by the number of taps between $V_{high}(k)$ and $V_{low}(k)$. Since the reference voltage range and resolution are determined during the design phase and can not be later modified based on actual circuit characteristics, such a scheme typically requires a wide range and many taps from the reference ladder. Thus, many switches are required to implement the multiplexers. The size of the switches could become relatively large due to the need for both PMOS and NMOS FETS (p-type and n-type metal-oxide-semiconductor field effect transistors) in parallel for a flat resistance response over a relatively wide reference voltage range. Furthermore, the interface between the switches and the logic gates 206 that drive them might need voltage level shifters, further increasing total layout size.

An improved scheme for offset compensation is disclosed in detail herein that not only mitigates or cancels the effect of offset voltages but that can be compactly realized and that provides a scalable trade-off between cancellation range and resolution.

Figure 3:
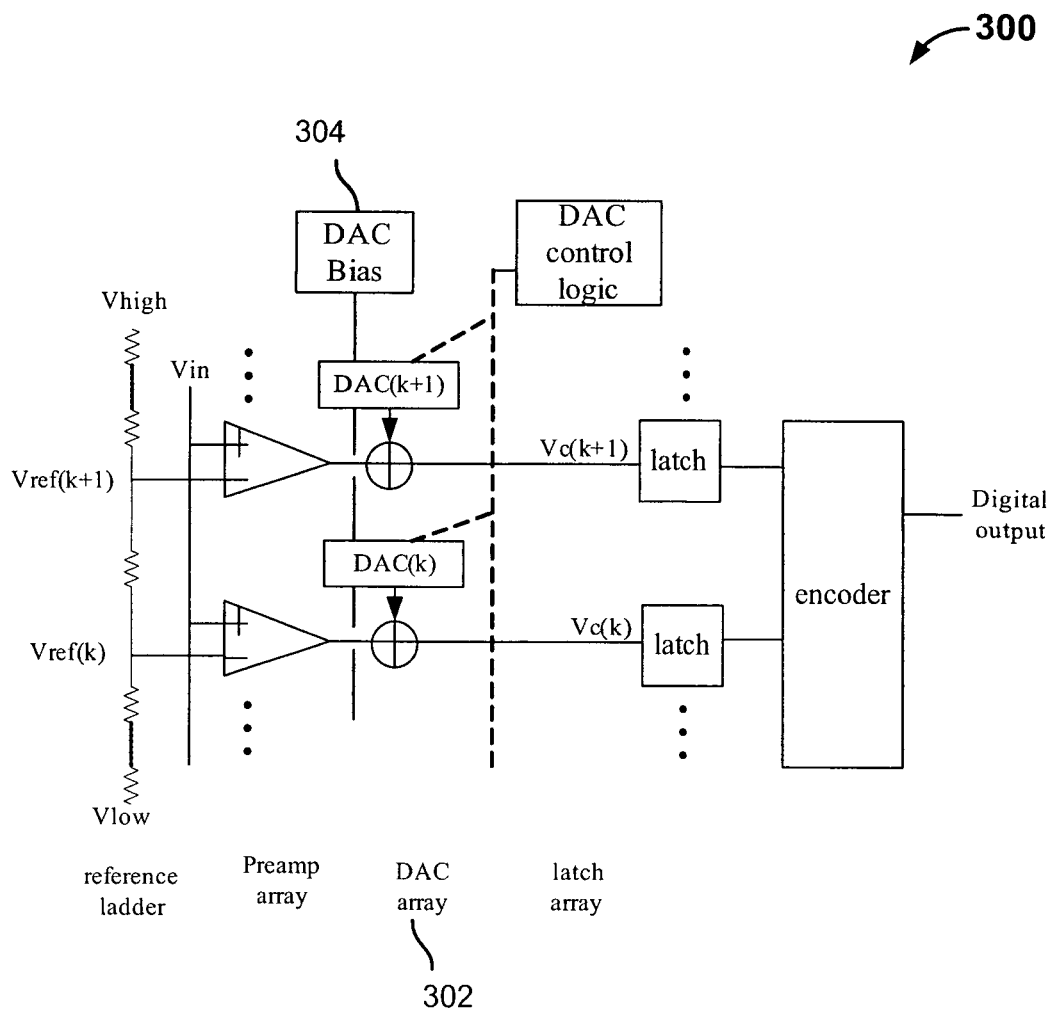
FIG. 3 illustrates a block diagram of an embodiment of an ADC in which offset compensation is provided by a digital-to-analog converter array.

FIG. 3 illustrates a block diagram of an embodiment of an ADC 300 in which offset compensation is provided by a digital-to-analog converter (DAC) array 302. The offset compensation for each slice is provided by a dedicated DAC. Specifically, an offset voltage or current is injected by the DAC of each slice to cancel the built-in offset of the slice. The DAC array 302 can be compactly realized in modern CMOS processes. Furthermore, the offset cancellation range can be adjusted by changing the DAC bias 304, which provides a flexible way to trade-off cancellation range with cancellation resolution given a fixed number of DAC bits.

Figure 4:
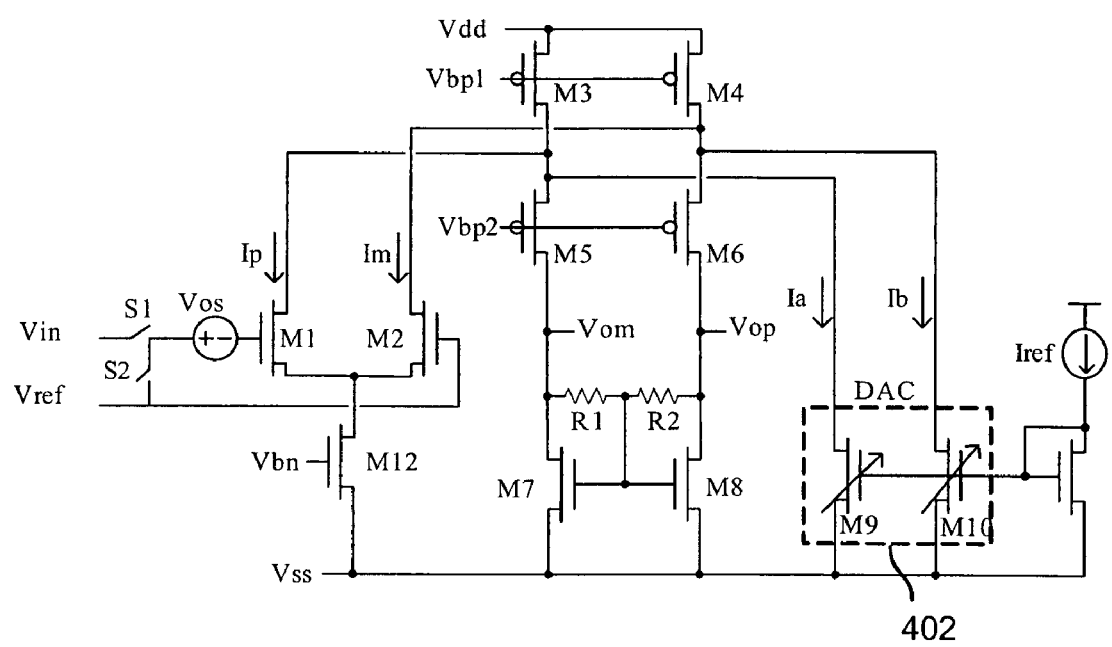
FIG. 4 illustrates a single-ended embodiment of a circuit diagram of a portion of the ADC of FIG. 3.

FIG. 4 illustrates an embodiment of a circuit diagram of a portion of ADC 300 of FIG. 3. The single-ended embodiment of only portions of the front-end (preamplifier and DAC) of a single slice is depicted in FIG. 4 for clarity. The input voltage is $V_{in}$, and the slice reference voltage from the reference ladder is $V_{ref}$. Transistors M1 and M2 of the preamplifier form a differential pair that convert the voltage difference at the preamplifier input, $V_{in}-V_{ref}$, into differential currents, $I_p$ and $I_m$. The differential currents are converted back to voltages, $V_{op}$ and $V_{om}$, by resistors R1 and R2 for next stage processing. The preamplifier output differential voltage (e.g., $V_c$ in FIG. 3) can be approximated by Equation 1:

$$\Delta V_{out} = V_{op} - V_{om} = g_m \cdot R \cdot (V_{in} - V_{ref}) \qquad \text{(Equation 1)}$$

In Equation 1, $g_m$ is the transconductance of the input differential pair M1 and M2, and R is the load resistance value (e.g., R1=R2=R/2). The preamplifier provides some gain and shields the inputs ($V_{in}$ and $V_{ref}$) from being kicked by the switching noise from the latch stage. The preamplifier also provides a way to convert the DC common mode voltages so that, for example, the inputs and the output can be separately optimized.

The built-in offset voltage of the slice can be referred to the input of the preamplifier and is represented in the given example by $V_{os}$. Although depicted in FIG. 4, $V_{os}$ is not a physical voltage in an actual circuit implementation but instead represents the net offset voltage resulting from all of the built-in offset voltages across the slice. The output offset voltage $V_{os\_out}$ resulting from this input offset voltage $V_{os}$ can be calculated using Equation 2:

$$V_{os\_out} = g_m \cdot R \cdot V_{os} \qquad \text{(Equation 2)}$$

The offset voltage $V_{os}$ effectively shifts the slice reference voltage $V_{ref}$ from its ideal value and may cause the ADC to behave nonlinearly.

In some embodiments, offset compensation is achieved using a DAC, such as DAC 402 of FIG. 4. The DAC injects two currents, $I_a$ and $I_b$, into the preamplifier. Varying magnitudes of $I_a$ and $I_b$ result for different DAC values. The total DAC current (i.e., the sum of $I_a$ and $I_b$) is constant for different DAC values for a given DAC gain. As depicted by the variable notation of DAC 402 in FIG. 4, in some embodiments, the DAC gain (i.e. the sum of $I_a$ and $I_b$ or the maximum $I_a$ and $I_b$ magnitude) can be varied over a prescribed range. Since the amount of current delivered to the load of the preamplifier depends on the $I_a$ and $I_b$ currents injected/drawn by the DAC, the output differential voltage of the preamplifier may be affected by the $I_a$ and $I_b$ currents. The shift in the preamplifier output differential voltage due to the $I_a$ and $I_b$ currents is given by Equation 3:

$$\Delta V_{out} = V_{op} - V_{om} = R \cdot (I_a - I_b) = R \cdot \Delta I_{DAC} \qquad \text{(Equation 3)}$$

Thus, the preamplifier output differential voltage can be shifted in different (positive and negative) directions by varying the magnitudes of $I_a$ and $I_b$. In this example, the shift in the output differential voltage of the preamplifier is positive when $I_a$ is greater than $I_b$ and is negative when $I_a$ is less than $I_b$. The maximum positive shift occurs when $I_a$ is a maximum and $I_b$ is zero, the maximum negative shift occurs when $I_a$ is zero and $I_b$ is a maximum, and no shift occurs if $I_a$ and $I_b$ are equal. Thus, the DAC provides a way to change the output voltage of the preamplifier.

The effect of the input referred built-in offset voltage $V_{os}$ can be cancelled if the shift or offset in the output voltage by the DAC as given by Equation 3 is equal in magnitude but opposite in sign to the output offset voltage resulting from $V_{os}$ i.e. $V_{os\_out}$ of Equation 2. The equilibrium condition is given by Equation 4:

$$R \cdot \Delta I_{DAC} + g_m \cdot R \cdot V_{os} = 0 \quad \text{(Equation 4)}$$

which simplifies to:

$$\Delta I_{DAC} = -g_m \cdot V_{os} \quad \text{(Equation 5)}$$

If Equation 5 is satisfied by the delta DAC current, $\Delta I_{DAC}$, the input referred built-in offset voltage $V_{os}$ is completely cancelled. In some cases, in a real realization, the exact cancellation of $V_{os}$ may not be possible due to the finite step size of resolution achievable with the DAC.

In some embodiments, the DAC is designed so that the relationship between its outputs and its reference current is given by Equation 6:

$$\Delta I_{DAC} = k_{DAC} \cdot I_{ref} \quad \text{(Equation 6)}$$

In Equation 6, $k_{DAC}$ is the DAC gain. In some embodiments, the gain $k_{DAC}$ is variable over a prescribed range. In some embodiments, the reference current of the DAC, $I_{ref}$, is forced as described by Equation 7 to:

$$I_{ref} = k_1 \cdot g_m \cdot V_{ref1} \quad \text{(Equation 7)}$$

In Equation 7, $k_1$ is a constant, $g_m$ is the transconductance of the preamplifier input differential pair M1 and M2, and $V_{ref1}$ is a reference voltage. The $I_{ref}$ bias circuit (e.g., 304 of FIG. 3) is designed in some embodiments using a $g_m$ replica circuit. The DAC injected currents can be referred to the input of the preamplifier as an offset voltage due to the DAC, $V_{os\_DAC}$, using Equation 8:

$$V_{os\_DAC} = \frac{\Delta I_{DAC}}{g_m} = \frac{k_{DAC} \cdot I_{ref}}{g_m} = \frac{k_{DAC} \cdot (k_1 \cdot g_m \cdot V_{ref1})}{g_m} = k_{DAC} \cdot k_1 \cdot V_{ref1} \quad \text{(Equation 8)}$$

In some embodiments, $V_{ref1}$ is designed to have the same dependency as the ADC LSB voltage (set by the reference ladder), e.g., both are scaled versions of the bandgap voltage. In such cases, $V_{os\_DAC}$ covers a prescribed ADC LSB range and maintains that range over temperature and process variations.

The offset cancellation range of the DAC is given by Equation 9:

$$V_{CANCEL\_RANGE} = \pm k_{DAC\_MAX} \cdot k_1 \cdot V_{ref1} \quad \text{(Equation 9)}$$

In Equation 9, $k_{DAC\_MAX}$ is the maximum value of the scalable DAC gain $k_{DAC}$. The offset cancellation range of the DAC array can be modified by scaling $V_{ref1}$, e.g., using another DAC in the common bias circuit (i.e. 304 of FIG. 3). Such a mechanism provides a flexible way to trade-off offset cancellation range and resolution given a fixed number of DAC bits. The offset cancellation range may be increased or decreased based on calibration results. For example, if the calibration outcome of one or more slices is saturated (i.e. is at a boundary of the cancellation range), $V_{ref1}$ can be increased to expand the cancellation range to ensure that the offset voltages $V_{os}$ of such slices are adequately cancelled. An increase in cancellation range, however, is at the expense of a decrease in cancellation resolution given a fixed number of DAC bits. However, if expanding the cancellation range of a given design increases yield, a coarser resolution may be acceptable in some cases. On the other hand, if a design is found to have lower than anticipated offset voltages $V_{os}$ after calibration, the cancellation range can be reduced, e.g., by decreasing $V_{ref1}$, which results in improved cancellation resolution given a fixed number of DAC bits.

Switches S1 and S2 in FIG. 4 are employed for offset calibration. During normal operation, S1 is closed, and S2 is open. During the offset calibration phase, S1 is open, and S2 is closed, which forces the built-in offset voltage $V_{os}$ to be applied. In some embodiments, the DAC is swept for one or more values of gain ($k_{DAC}$) to locate the transition boundary. In such cases, the DAC can be calibrated to either value associated with the zero or one of the transition boundary. In various embodiments, the DAC value may be found using binary or sequential search algorithms. In some embodiments, the DAC value is stored for normal operation using digital registers. Since the calibration can be performed with the normal ADC clock frequency, the dynamic offset voltage, primarily caused by mismatches in the latch stage, can also be captured. In various embodiments, the ADC slices are calibrated sequentially, in parallel, and/or in groups. In some embodiments, after a calibration phase, the DAC values are read back to determine the range of the calibration results and to determine whether to scale $V_{ref}$ to change the cancellation range as described above.

DAC 402 can be implemented using any appropriate technique. In some embodiments, the DAC is implemented in NMOS. In such cases, the DAC can be controlled directly by the potentially lower voltage logic gates without any level shifters, and the overall layout of such a DAC can be made very compact.

Figure 5:
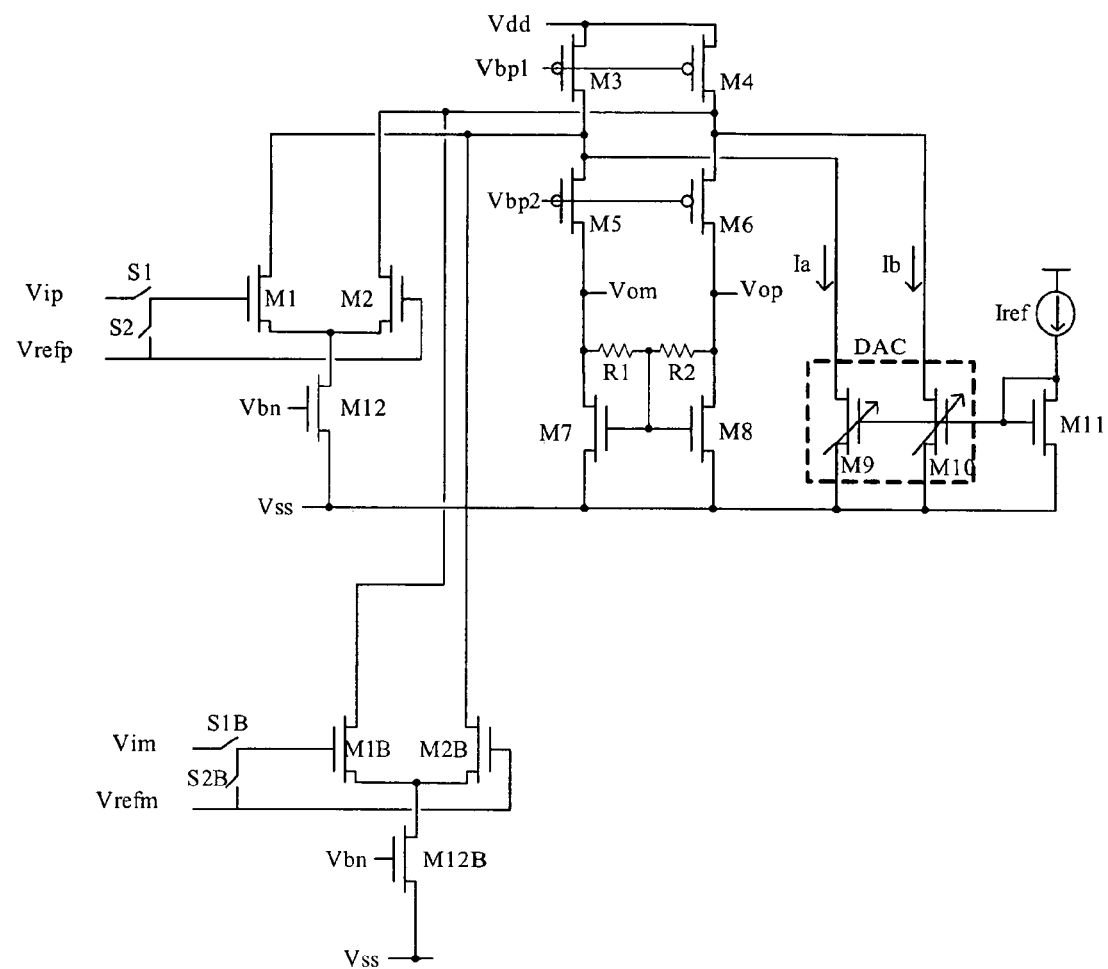
FIG. 5 illustrates a fully differential embodiment of a circuit diagram of a portion of the ADC of FIG. 3.

FIG. 5 illustrates an embodiment of a circuit diagram of a portion of ADC 300 of FIG. 3. A fully differential embodiment of a portion of the front-end (preamplifier and DAC) of a single slice is depicted in FIG. 5. The only difference between FIG. 4 and FIG. 5 is that FIG. 5 includes an additional differential pair (M1B and M2B) to handle fully differential input signals, $V_{ip}$ and $V_{im}$. In this embodiment, the reference ladder is modified to provide differential reference voltages, $V_{refp}$ and $V_{refm}$. The offset compensation method for the embodiment of FIG. 5 is identical to that described with respect to FIG. 4.

As described herein, a DAC can be employed to compensate for offset voltages. The layout of such a DAC can be made very compact. The offset cancellation range and cancellation resolution can easily be traded. Although described in detail with respect to an ADC, the techniques disclosed herein may be similarly employed to compensate for offset voltages in an amplifier or any other circuit in which offsets are desired to be cancelled. Although using a DAC for offset compensation is described, any other appropriate circuit configuration for injecting current and/or voltage to cancel an offset can be similarly employed.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for offset compensation, comprising:
   a circuit having an undesired current or voltage offset; and a digital-to-analog converter (DAC) coupled to the circuit and configured to at least in part compensate for the undesired current or voltage offset;

wherein:

the DAC is configured to at least in part compensate for the undesired current or voltage offset including by injecting current or voltage into the circuit;

the injected current or voltage shifts a current or voltage of the circuit; and a shift in the current or voltage of the circuit due to the injected current or voltage is similar in magnitude but opposite in polarity to a shift in the current or voltage of the circuit caused by the undesired current or voltage offset.

2. A system as recited in claim 1, wherein the injecting current or voltage into the circuit comprises drawing current or voltage from the circuit.

3. A system as recited in claim 1, wherein the DAC has a variable gain.

4. A system as recited in claim 1, wherein the DAC has an associated reference current or voltage that depends on a transconductance of a differential pair of the circuit.

5. A system as recited in claim 1, wherein the DAC has an associated offset cancellation range and wherein when a reference current or voltage associated with the DAC is scaled, the offset cancellation range of the DAC is changed.

6. A system as recited in claim 1, wherein the DAC has an associated reference current or voltage comprising a scaled version of a bandgap current or voltage.

7. A system as recited in claim 1, further comprising a DAC bias circuit.

8. A system as recited in claim 7, wherein the DAC bias circuit comprises a transconductance replica circuit.

9. A system as recited in claim 7, wherein the DAC is a first DAC and further comprising a second DAC in the DAC bias circuit for scaling a reference current or voltage associated with the first DAC.

10. A system as recited in claim 1, wherein the DAC is configured to be calibrated by a binary search algorithm.

11. A system as recited in claim 1, wherein the DAC is configured to be calibrated by a sequential search algorithm.

12. A system as recited in claim 1, wherein the DAC has an associated reference current or voltage that is scaled based on a calibration value of the DAC.

13. A system as recited in claim 1, wherein calibration of the DAC is performed using an operating clock frequency of the circuit.

14. A system as recited in claim 1, wherein the DAC is implemented in NMOS (n-type metal-oxide-semiconductor field effect transistors).

15. A system as recited in claim 14, wherein the DAC is controlled by low voltage logic.

16. A system as recited in claim 1, wherein the circuit comprises an amplifier.

17. A system as recited in claim 1, wherein the circuit comprises a slice of an analog-to-digital converter (ADC).

18. A system as recited in claim 1, wherein the circuit comprises one slice of a plurality of slices included in an analog-to-digital converter (ADC) and wherein the DAC comprises one DAC of a DAC array associated with the ADC.

19. A system as recited in claim 18, wherein the plurality of DACs included in the DAC array of the ADC are calibrated sequentially, in parallel, or in groups.

20. A method for offset compensation, comprising:

receiving an indication of an undesired current or voltage offset in a circuit; and compensating at least in part for the undesired current or voltage offset using a digital-to-analog converter (DAC), wherein the DAC is coupled to the circuit;

wherein:

compensating at least in part for the undesired current or voltage offset includes injecting current or voltage into the circuit;

the injected current or voltage shifts a current or voltage of the circuit; and a shift in the current or voltage of the circuit due to the injected current or voltage is similar in magnitude but opposite in polarity to a shift in the current or voltage of the circuit caused by the undesired current or voltage offset.

21. A method as recited in claim 20, wherein the DAC has an associated offset cancellation range and wherein when a reference current or voltage associated with the DAC is scaled, the offset cancellation range of the DAC is changed.

22. A method as recited in claim 20, wherein the injecting current or voltage into the circuit comprises drawing current or voltage from the circuit.

23. A method as recited in claim 20, wherein the DAC has a variable gain.

24. A method as recited in claim 20, wherein the DAC has an associated reference current or voltage that depends on a transconductance of a differential pair of the circuit.

25. A method as recited in claim 20, wherein the DAC has an associated reference current or voltage comprising a scaled version of a bandgap current or voltage.

* * * * *